(12) United States Patent
Rahman et al.

(10) Patent No.: US 11,848,389 B2
(45) Date of Patent: Dec. 19, 2023

(54) LOW TURN ON AND HIGH BREAKDOWN VOLTAGE LATERAL DIODE

(71) Applicant: Ohio State Innovation Foundation, Columbus, OH (US)

(72) Inventors: Mohammad Wahidur Rahman, Columbus, OH (US); Siddharth Rajan, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 199 days.

(21) Appl. No.: 17/206,570

(22) Filed: Mar. 19, 2021

(65) Prior Publication Data
US 2021/0296510 A1 Sep. 23, 2021

Related U.S. Application Data

(60) Provisional application No. 62/991,761, filed on Mar. 19, 2020.

(51) Int. Cl.
| | |
|---|---|
| *H01L 29/87* | (2006.01) |
| *H01L 29/872* | (2006.01) |
| *H01L 29/40* | (2006.01) |
| *H01L 29/205* | (2006.01) |
| *H01L 29/20* | (2006.01) |

(52) U.S. Cl.
CPC ........ *H01L 29/872* (2013.01); *H01L 29/2003* (2013.01); *H01L 29/205* (2013.01); *H01L 29/404* (2013.01)

(58) Field of Classification Search
CPC . H01L 29/872; H01L 29/2003; H01L 29/205; H01L 29/404; H01L 23/3171; H01L 29/0657; H01L 29/402

USPC ........................................................... 257/76
See application file for complete search history.

(56) References Cited

U.S. PATENT DOCUMENTS

| | | | |
|---|---|---|---|
| 3,268,744 A | 8/1966 | Kaiser | |
| 3,365,631 A | 1/1968 | Spielberger | |
| 4,147,670 A | 4/1979 | Shohata | |
| 5,512,773 A | 4/1996 | Wolf | |
| 9,276,529 B1 * | 3/2016 | Brown | H03F 3/195 |
| 2008/0157127 A1 * | 7/2008 | Bertin | H01L 27/1021 |
| | | | 257/209 |

(Continued)

FOREIGN PATENT DOCUMENTS

WO 2018159350 A1 9/2018

OTHER PUBLICATIONS

Office Action issued for U.S. Appl. No. 17/002,253, dated Dec. 24, 2021.

(Continued)

*Primary Examiner* — Mohammad M Hoque
(74) *Attorney, Agent, or Firm* — Meunier Carlin & Curfman LLC (57) ABSTRACT

A hybrid Schottky diode is described herein where the forward characteristics are determined by the metal-semiconductor junction, and the reverse characteristics and breakdown are determined by the metal/dielectric/semiconductor junction. Experimental demonstration of such hybrid Schottky diodes shows significant improvement in the breakdown performance with average breakdown field up to 2.22 MV/cm with reduced turn on of 0.47 V and enable state-of-art power switching figure of merit for GaN lateral Schottky diodes.

18 Claims, 13 Drawing Sheets

(56) References Cited

U.S. PATENT DOCUMENTS

| | | | |
|---|---|---|---|
| 2010/0123812 A1 | 5/2010 | Sekiguchi | |
| 2011/0049526 A1* | 3/2011 | Chu | H01L 29/66462 |
| | | | 257/E29.089 |
| 2011/0309470 A1 | 12/2011 | Grebs | |
| 2012/0007097 A1* | 1/2012 | Hebert | H01L 29/66143 |
| | | | 438/570 |
| 2013/0011963 A1 | 1/2013 | Lien | |
| 2014/0166107 A1 | 6/2014 | Lee | |
| 2015/0129876 A1 | 5/2015 | Mohammed | |
| 2015/0311352 A1 | 10/2015 | Yamazaki | |
| 2016/0197203 A1* | 7/2016 | Hu | H01L 29/205 |
| | | | 438/579 |
| 2017/0301798 A1* | 10/2017 | Kaleta | H01L 29/402 |
| 2019/0058041 A1 | 2/2019 | Dasgupta et al. | |
| 2019/0148563 A1 | 5/2019 | Sasaki et al. | |
| 2019/0225754 A1 | 7/2019 | Nukada | |
| 2019/0267498 A1 | 8/2019 | Cheng | |
| 2019/0287728 A1 | 9/2019 | Cho | |
| 2019/0393210 A1* | 12/2019 | Then | H01L 21/26586 |
| 2020/0006322 A1* | 1/2020 | Then | H01L 27/0255 |
| 2020/0006412 A1 | 1/2020 | Li | |
| 2020/0135478 A1* | 4/2020 | Passlack | H01L 29/66462 |
| 2020/0169683 A1 | 5/2020 | Yamamoto | |
| 2020/0411505 A1* | 12/2020 | Gossner | H01L 27/0605 |
| 2021/0273060 A1 | 9/2021 | Kase et al. | |
| 2021/0296510 A1* | 9/2021 | Rahman | H01L 29/404 |
| 2021/0343836 A1* | 11/2021 | Huang | H01L 29/1041 |
| 2021/0343880 A1 | 11/2021 | Arima et al. | |

OTHER PUBLICATIONS

Aida, Hideo, et al. "Growth of β-Ga2O3 single crystals by the edge-defined, film fed growth method." Japanese Journal of Applied Physics 47.11R (2008): 8506.

Baliga, B. Jayant. "Semiconductors for high-voltage, vertical channel field-effect transistors." Journal of applied Physics 53.3 (1982): 1759-1764.

Farzana, Esmat, et al. "Influence of metal choice on (010) β-Ga2O3 Schottky diode properties." Applied Physics Letters 110.20 (2017): 202102.

Fowler, Ralph Howard, and Lothar Nordheim. "Electron emission in intense electric fields." Proceedings of the Royal Society of London. Series A, Containing Papers of a Mathematical and Physical Character 119.781 (1928): 173-181.

Frenkel, J. "On pre-breakdown phenomena in insulators and electronic semi-conductors." Physical Review 54.8 (1938): 647.

Galazka, Z., et al. "Czochralski growth and characterization of β-Ga2O3 single crystals." Crystal Research and Technology 45.12 (2010): 1229-1236.

Green, Andrew J., et al. "3.8-MV/cm Breakdown Strength of MOVPE-Grown Sn-Doped β-Ga2O3 MOSFETs." IEEE Electron Device Letters 37.7 (2016): 902-905.

Higashiwaki, Masataka, et al. "Gallium oxide (Ga2O3) metal-semiconductor field-effect transistors on single-crystal β-Ga2O3 (010) substrates." Applied Physics Letters 100.1 (2012): 013504.

Hu, Zongyang, et al. "Enhancement-mode Ga 2 O 3 vertical transistors with breakdown voltage > 1 kV." IEEE Electron Device Letters 39.6 (2018): 869-872.

Joishi, et al., "Breakdown Characteristics of β-(A10.22Ga0.78)2O3/Ga2O3 Field-Plated Modulation-Doped Field-Effect Transistors" in IEEE Electron Device Letters, vol. 40, No. 8, pp. 1241-1244, Aug. 2019.

Konishi, Keita, et al. "1-kV vertical Ga2O3 field-plated Schottky barrier diodes." Applied Physics Letters 110.10 (2017): 103506.

Krishnamoorthy, Sriram, et al. "Delta-doped β-gallium oxide field-effect transistor." Applied Physics Express 10.5 (2017): 051102.

Li, Wenshen, et al. "2.44 kV Ga 2 O 3 vertical trench Schottky barrier diodes with very low reverse leakage current." 2018 IEEE International Electron Devices Meeting (IEDM). IEEE, 2018.

Ma, Nan, et al. "Intrinsic electron mobility limits in β-Ga2O3." Applied Physics Letters 109.21 (2016): 212101.

Michel-Calendini, F. M., and G. Mesnard. "Band structure and optical properties of tetragonal BaTiO3." Journal of Physics C: Solid State Physics 6.10 (1973): 1709.

Ohira, S., et al. "Growth of hexagonal GaN films on the nitridated β-Ga2O3 substrates using RF-MBE." physica status solidi c 4.7 (2007): 2306-2309. Doi: 10.1002/pssc.200674877.

Sasaki, Kohei, et al. "First demonstration of Ga2O3 trench MOS-type Schottky barrier diodes." IEEE Electron Device Letters 38.6 (2017): 783-785.

Silvaco—TCAD—Device Simulation "Victory Device Simulator" Sep. 28, 2020. https://www.silvaco.com/products/tcad/devicesimulation/atlas/atlas.html.

Víllora, Encarnación G., et al. "Large-size β-Ga2O3 single crystals and wafers." Journal of Crystal Growth 270.3-4 (2004): 420-426.

Wong, et al., "Current Aperture Vertical β-Ga2O3 MOSFETs Fabricated by N- and Si-Ion Implantation Doping", IEEE Electron Device Letters 40.3 (2018): 431-434.

Wong, Man Hoi, et al. "Field-plated Ga2O3 MOSFETs with a breakdown voltage of over 750 V." IEEE Electron Device Letters 37.2 (2015): 212-215.

Yang, Jiancheng, et al. " High Breakdown Voltage (−201) β-Ga2O3 Schottky Rectifiers." IEEE Electron Device Letters 38.7 (2017): 906-909.

Zetterling, C. M., Dahlquist, F., Lundberg, N., Ostling, M., Rottner, K., & Ramberg, L. (1997). High voltage silicon carbide Junction Barrier Schottky rectifiers. Proceedings of the IEEE Cornell Conference on Advanced Concepts in High Speed Semiconductor Devices and Circuits, 256-263. https://doi.org/10.1109/cornel.1997.649365.

Zhu, L., & Chow, T. P. (2008). Analytical modeling of high-voltage 4H—SiC junction barrier Schottky (JBS) rectifiers. IEEE Transactions on Electron Devices, 55(8), 1857-1863. https://doi.org/10.1109/TED.2008.926.

Office Action issued for U.S. Appl. No. 17/002,253, dated Aug. 18, 2021.

Habib et al. "Spectroscopic Ellipsometry Study of the Dielectric Function of Cu(In1-xGax)3Se5 Bulk Compounds" World Journal of Condensed Matter Physics, 7, 99-110 (Year: 2017).

Xia, Zhanbo, et al. "Metal/BaTiO3/β-Ga2O3 dielectric heterojunction diode with 5.7 MV/cm breakdown field." Applied Physics Letters 115.25 (2019): 252104.

Razzak, Towhidur, et al. "BaTiO3/A10. 58GaO. 42N lateral heterojunction diodes with breakdown field exceeding 8 MV/cm." Applied Physics Letters 116.2 (2020): 023507.

Zhang, T., et al. "A>3 kV/2.94 m Ω.cm2 and Low Leakage Current with Low Turn-On Voltage Lateral GaN Schottky Barrier Diode on Silicon Substrate with Anode Engineering Technique" (2019) IEEEEDL, vol. 40(10), p. 1583-1586.

Hanawa, Hideyuki, et al. "Numerical Analysis of Breakdown Voltage Enhancement in AlGaN/GaN HEMTs with a High-k Passivation Layer." IEEE Transactions on Electron Devices 61.3 (2014): 769-775.

* cited by examiner

LOW TURN ON AND HIGH BREAKDOWN VOLTAGE LATERAL DIODE

CROSS-REFERENCE TO RELATED APPLICATIONS

This application claims the benefit of U.S. provisional patent application No. 62/991,761, filed on Mar. 19, 2020, and entitled "Method of Forming Low Turn on and High Breakdown Voltage Lateral Diode," the disclosure of which is expressly incorporated herein by reference in its entirety.

BACKGROUND

The high breakdown field of wide bandgap semiconductors such as GaN makes them attractive for high voltage switching applications. The practical realization of such the material breakdown field within a device requires the use of p-n junction, and turn on voltage comparable to the bandgap of GaN. However, the on-state power loss due to the p-n diode turn on voltage can be typically larger than series resistance losses at voltage below 3.2 kV. Schottky diodes provide the advantage of low turn on voltage, but the maximum field achievable is limited by the metal/semiconductor barrier height. Recently, it was shown that high dielectric permittivity heterojunctions reduce the field at the metal Schottky barrier and make electric fields uniform in the depletion region, thus enabling higher average fields and breakdown voltage. However, the introduction of high permittivity dielectrics can also increase the turn on voltage of Schottky diodes.

It is with respect to these and other considerations that the various aspects and embodiments of the present disclosure are presented.

SUMMARY

A hybrid Schottky diode is described herein where the forward characteristics are determined by the metal-semiconductor junction, and the reverse characteristics and breakdown are determined by the metal/dielectric/semiconductor junction. Experimental demonstration of such hybrid Schottky diodes shows significant improvement in the breakdown performance with average breakdown field up to 2.22 MV/cm with reduced turn on of 0.47 V and enables state-of-art power switching figures of merit for GaN lateral Schottky diodes.

In an implementation, a lateral Schottky diode comprises: an anode; a cathode; and a high-K dielectric with dielectric constant greater than 25 disposed between the anode and the cathode.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

Figure 1:
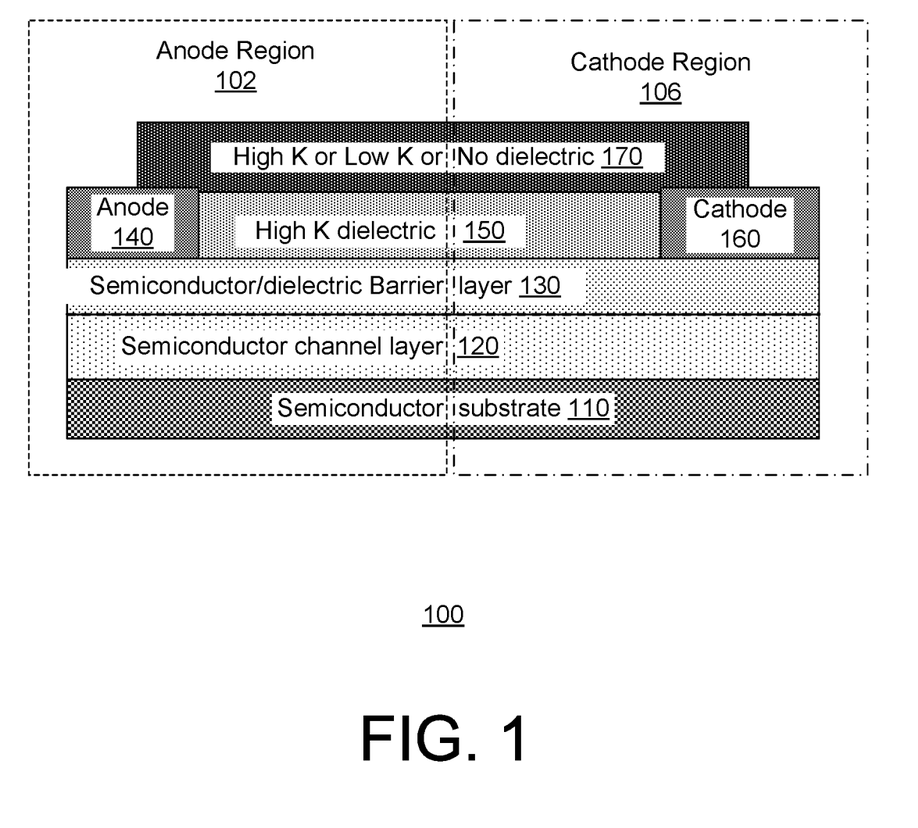
FIG. 1 is a schematic of an implementation of a lateral diode.

FIG. 1 is a schematic of an implementation of a lateral diode 100 (e.g., a lateral Schottky diode, also referred to as a Schottky barrier diode (SBD)). A semiconductor substrate 110 has deposited thereon a semiconductor channel layer 120 and, on the semiconductor channel layer 120, a semiconductor/dielectric barrier layer 130. Disposed on portions of the semiconductor/dielectric barrier layer 130 are an anode 140, a high-K (high dielectric constant) dielectric 150, and a cathode 160. This high-K dielectric 150 will be any dielectric material which has dielectric constant greater than 25. The high-K dielectric 150 is disposed between the anode 140 and the cathode 160 of the lateral diode 100 in such a way that the metal-semiconductor junction will determine low turn on voltage and the metal/dielectric/semiconductor junction will determine high breakdown voltage. A high-K dielectric or a low-K (low dielectric constant) dielectric 170 (or no dielectric) is disposed on the high-K dielectric 150 and at least a portion of the anode 140 and the cathode 160. Thus, the lateral diode 100 has an anode region 102 and a cathode region 106.

The anode 140 and the cathode 160 may take various forms, depending on the implementation. The various forms of the anode 140 and the cathode 160 (and thus the anode region 102 and the cathode region 106) are described further herein. In some implementations, the anode region 102 may comprise an anode contact region and an anode field plate (FP) region. Region-wise diode structures are provided herein with possible variations. A device may use any combination of the structures from each region, depending on the implementation.

Deposition of high-K and low-K dielectric layers in the structures described herein (e.g., represented by the various schematics of the drawings) could be done by any conventional deposition method such as chemical vapor deposition (CVD), pulsed laser deposition (PLD), physical vapor deposition (PVD), atomic layer deposition (ALD), spin coating, etc.

The cathode region 106 comprises ohmic metal connected to conducting channel (called as cathode) and combination of high-K and low-K dielectric layers adjacent to this cathode.

Figure 2:
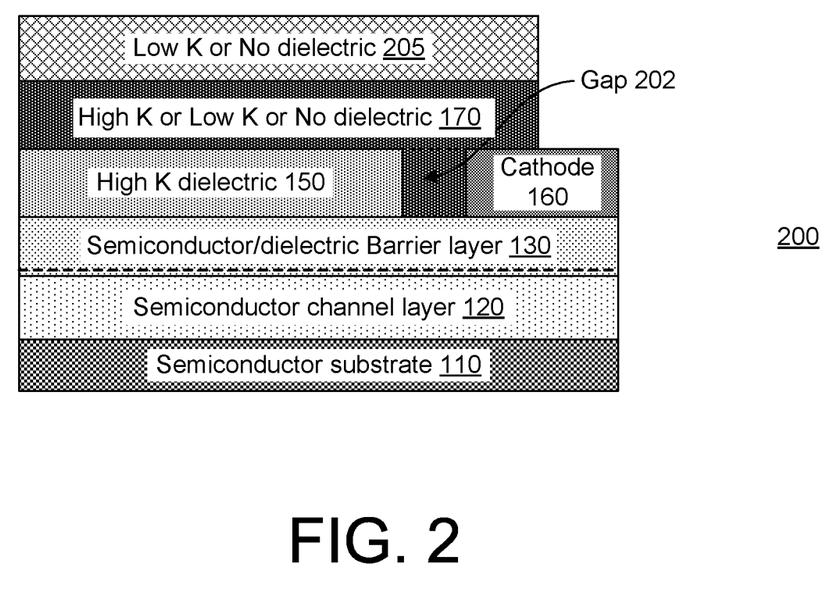
FIG. 2 is a schematic of an implementation of a cathode region for use with a lateral diode.
Figure 3:
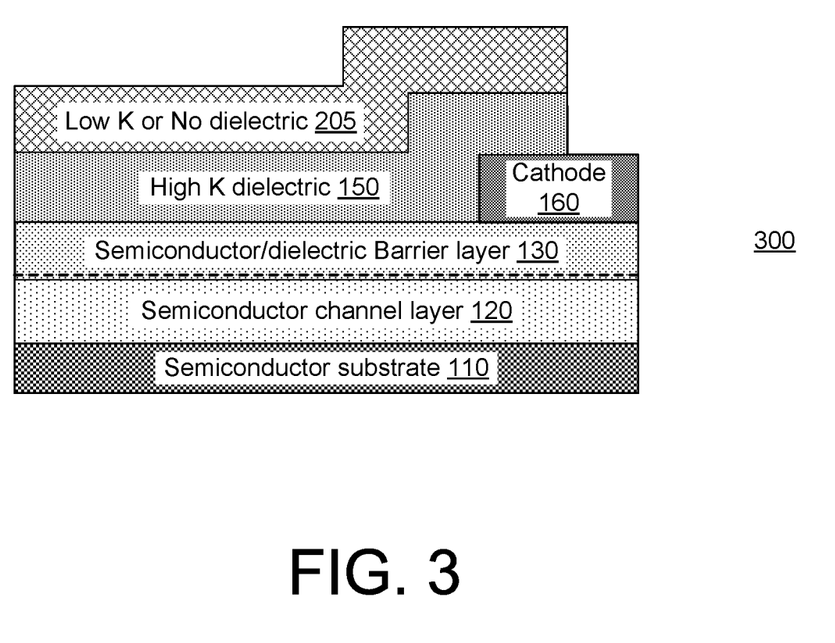
FIG. 3 is a schematic of another implementation of a cathode region for use with a lateral diode.
Figure 4:
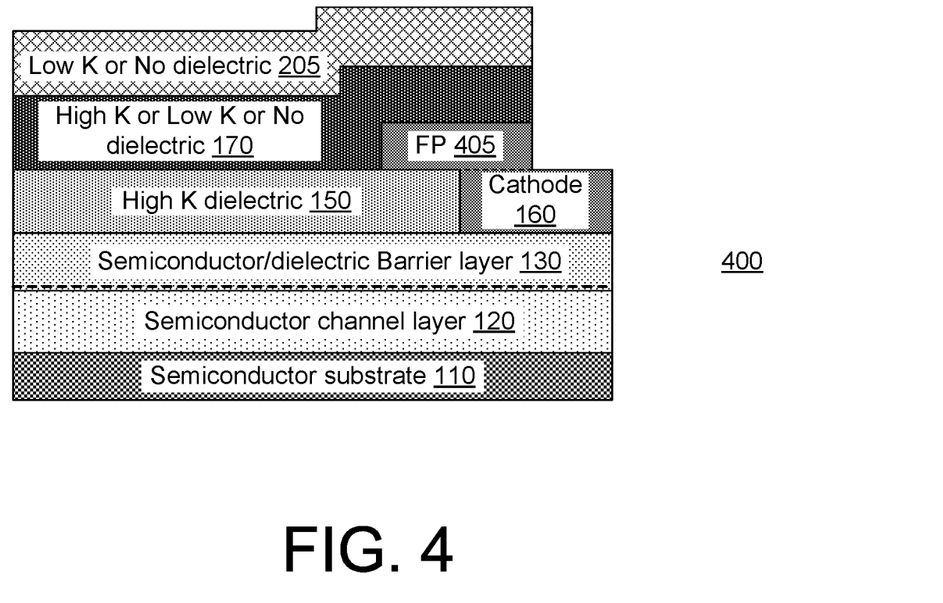
FIG. 4 is a schematic of another implementation of a cathode region for use with a lateral diode.

Three cathode region 106 design variations are described to ensure proper electric field management for high breakdown performance.

FIG. 2 is a schematic of an implementation of a cathode region for use with a lateral diode 200. FIG. 2 shows a cathode 160 contact and high-K dielectric 150 with a gap 202 in between them. The gap 202 may be filled by a second high-K dielectric or any other low-K dielectric, or this gap will remain empty (represented as 170 in FIG. 2). If the second high-K dielectric is deposited, then a low-K dielectric will cover this high-K dielectric or no dielectric will be deposited (represented as 205 in FIG. 2).

FIG. 3 is a schematic of another implementation of a cathode region for use with a lateral diode 300. FIG. 3 shows a cathode 160 contact covered by a high-K dielectric 150. Another low-K dielectric will cover this high-K dielectric layer; otherwise, no dielectric will be deposited, depending on the implementation and represented as 205 in FIG. 3.

FIG. 4 is a schematic of another implementation of a cathode region for use with a lateral diode 400. FIG. 4 shows a cathode 160 contact with metal extension toward anode region (referred to herein as a cathode field plate (FP) 405). At least part of the FP 405 is disposed on the first high-K dielectric 150, which is covered by the second high-K dielectric or a low-K dielectric or no dielectric and represented as 170 in FIG. 4. If the second high-K dielectric is deposited, then a low-K dielectric will cover this high-K dielectric; otherwise, no dielectric will be deposited, depending on the implementation and represented as 205 in FIG. 4.

The anode region 102 is combination of the anode contact and anode field plate with adjacent high-K dielectric. Depending on the implementation, the anode contact design has only Schottky metal or both Schottky and ohmic metal deposited after fully or partially etching of barrier layer. Three anode contact implementations are described herein to ensure low turn on of the device provided herein.

Figure 5:
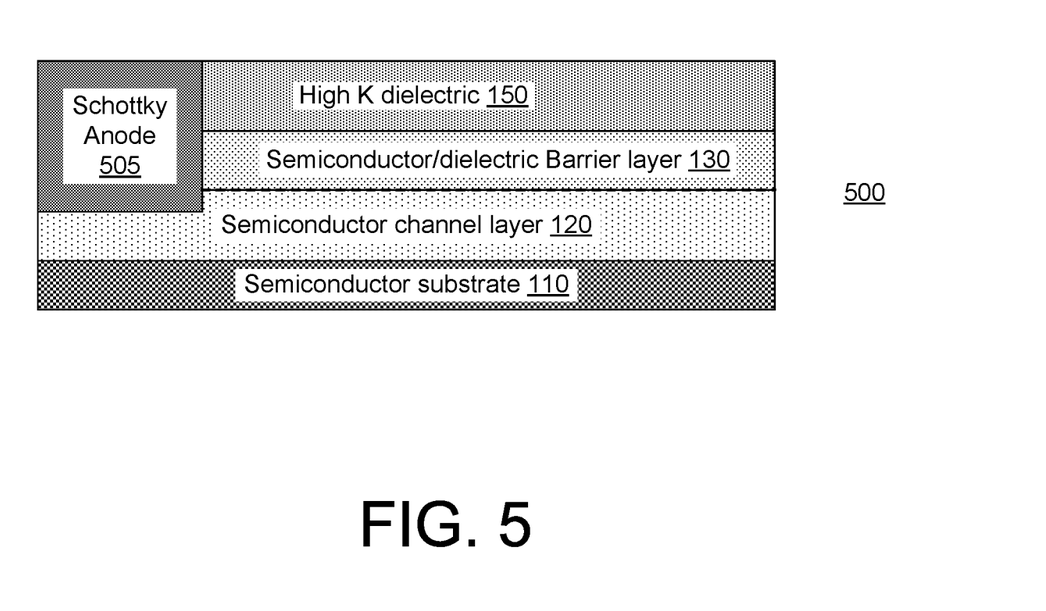
FIG. 5 is a schematic of an implementation of an anode contact region contact for use with a lateral diode.

FIG. 5 is a schematic of an implementation of an anode contact region for use with a lateral diode 500. FIG. 5 shows Schottky metal (Schottky anode 505) connected to the carrier channel from side. This is done by depositing the metal after fully etched of the barrier layer 130 and partial etching of the semiconductor channel layer 120.

Figure 6:
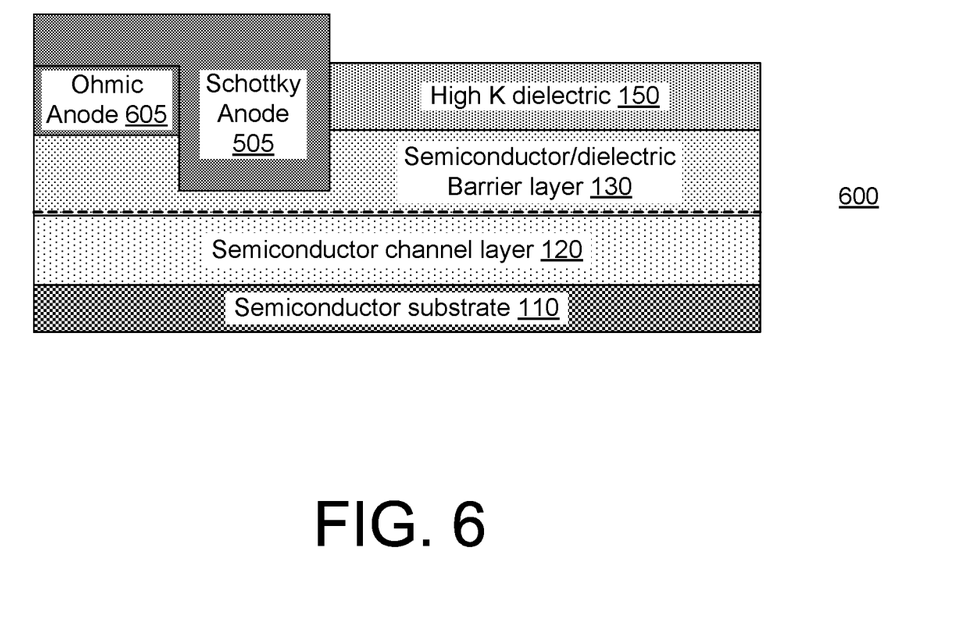
FIG. 6 is a schematic of another implementation of an anode region contact for use with a lateral diode.

FIG. 6 is a schematic of another implementation of an anode contact region for use with a lateral diode 600. FIG. 6 comprises both ohmic and Schottky metal, shown as an ohmic anode 605 and a Schottky anode 505, respectively. The ohmic metal of the ohmic anode 605 is connected to the channel and the Schottky anode 505 is not connected. The Schottky anode 505 is deposited after the ohmic metal deposition of the ohmic anode 605 and partial etching of the barrier layer 130.

Figure 7:
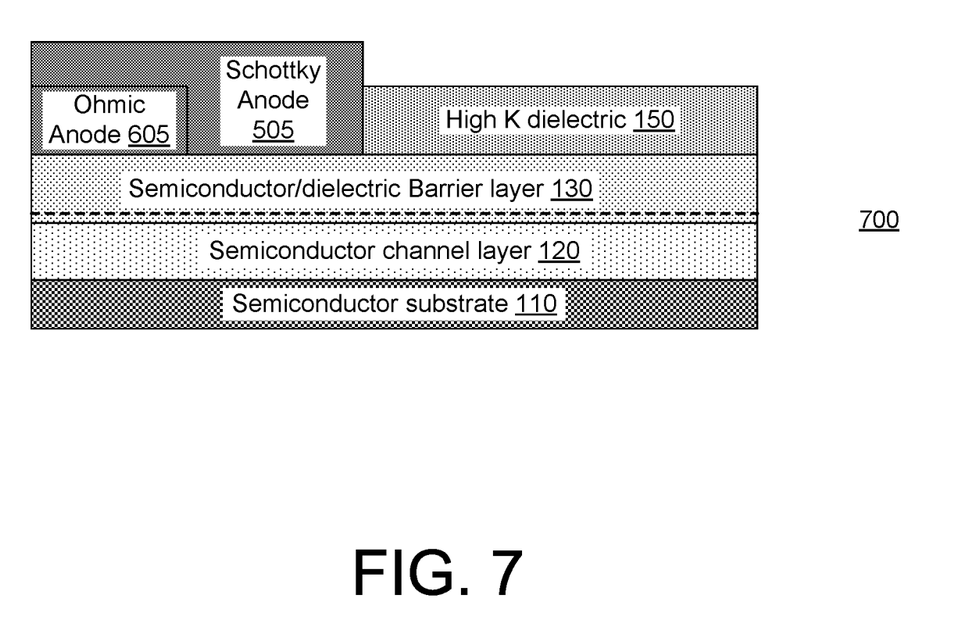
FIG. 7 is a schematic of another implementation of an anode contact region for use with a lateral diode.

FIG. 7 is a schematic of another implementation of an anode contact region for use with a lateral diode 700. FIG. 7 is similar to FIG. 6 with exception of no etching is done in the barrier layer 130 before depositing the Schottky anode 505.

The anode field plate design has a metal extension connected to the anode (referred to herein as an anode field plate), which is covered by the various high-K and/or low-K dielectric layers. Four anode field plate design implementations are described herein to ensure proper electric field management for high breakdown performance.

Figure 8:
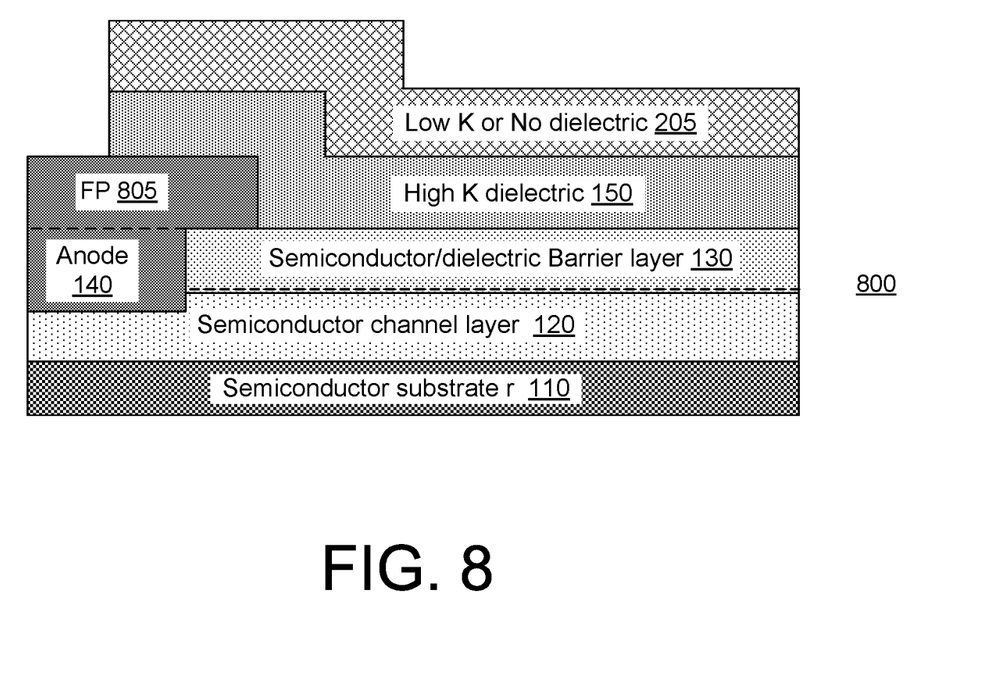
FIG. 8 is a schematic of an implementation of an anode field plate region for use with a lateral diode.

FIG. 8 is a schematic of an implementation of an anode field plate region for use with a lateral diode 800. FIG. 8 has a field plate (FP) 805 disposed on the barrier layer 130 and covered by high-K dielectric 150. Another low-K dielectric will cover this high-K layer; otherwise, no dielectric will be deposited, depending on the implementation and represented as 205 in FIG. 8.

Figure 9:
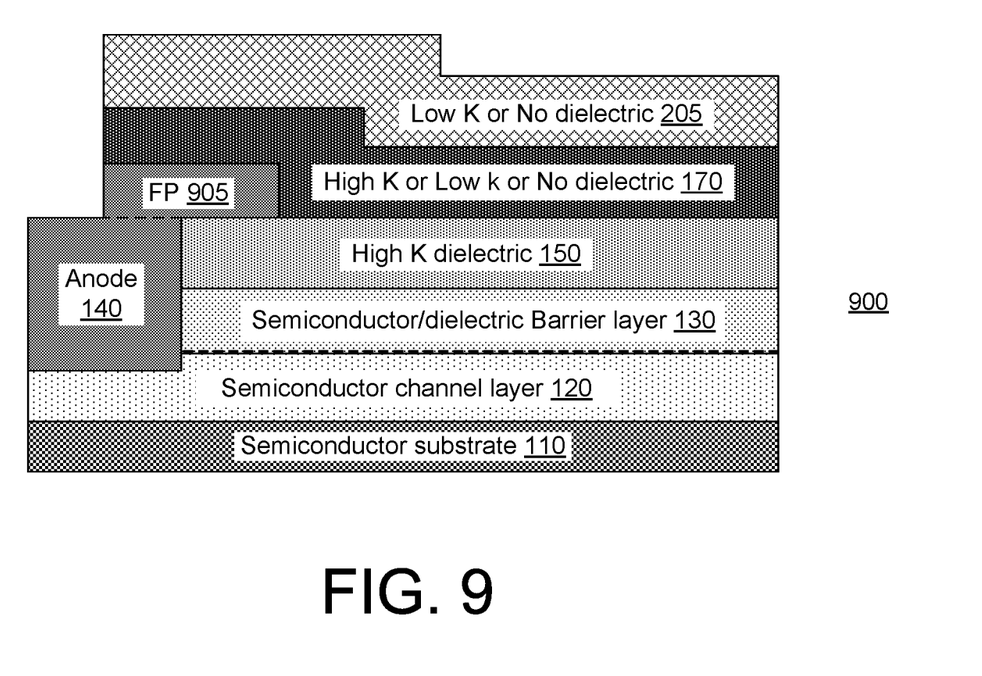
FIG. 9 is a schematic of another implementation of an anode field plate region for use with a lateral diode.

FIG. 9 is a schematic of another implementation of an anode field plate region for use with a lateral diode 900. FIG. 9 has field plate (FP) 905 on the first high-K dielectric 150 which is covered by the second high-K or a low-K dielectric or no dielectric and represented as 170 in FIG. 9. If the second high-K dielectric is deposited, then low-K dielectric will cover this high-K dielectric; otherwise, no dielectric will be deposited, depending on the implementation and represented as 205 in FIG. 9.

Figure 10:
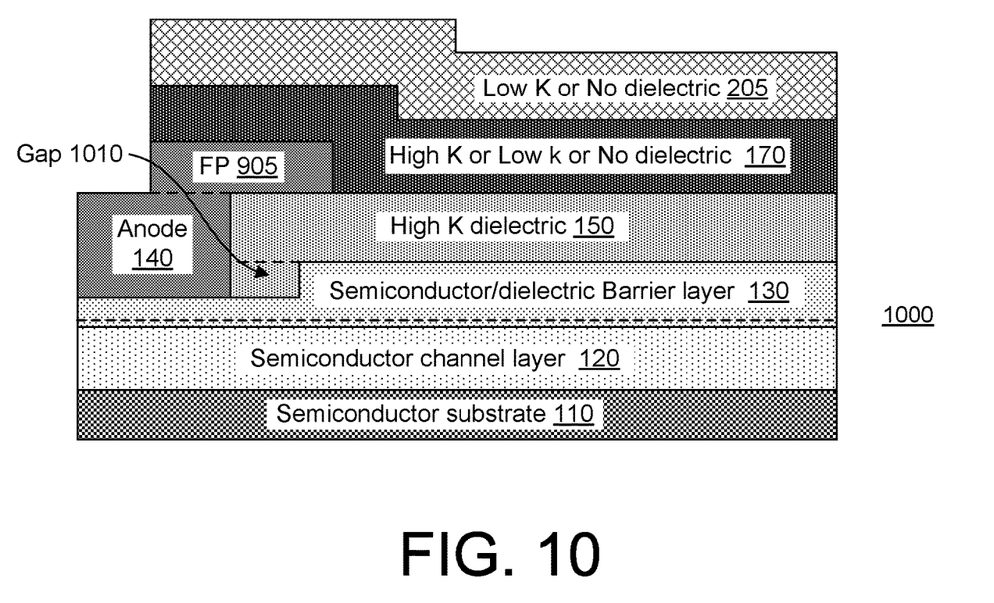
FIG. 10 is a schematic of another implementation of an anode field plate region for use with a lateral diode.

FIG. 10 is a schematic of another implementation of an anode field plate region for use with a lateral diode 1000. FIG. 10 is similar to the FIG. 9 with exception of a lateral gap 1010 in between the anode 140 contact and barrier layer 130. This gap 1010 will be filled by the high-K dielectric 150.

Figure 11:
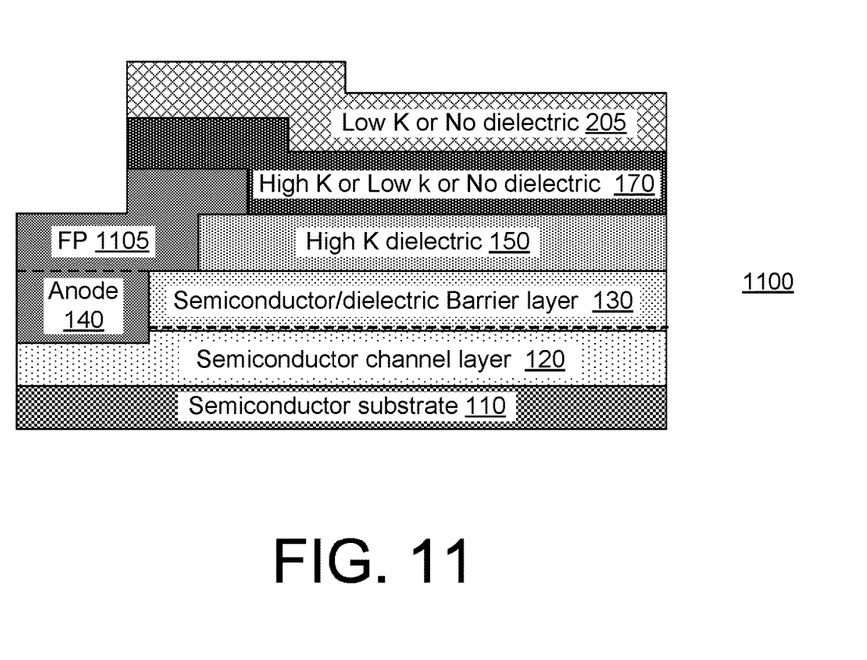
FIG. 11 is a schematic of another implementation of an anode field plate region for use with a lateral diode.

FIG. 11 is a schematic of another implementation of an anode field plate region for use with a lateral diode 1100. FIG. 11 has a field plate (FP) 1105 on both a portion of the barrier layer 130 and a portion of the first high-K dielectric layer 150. The FP 1105 is covered by the second high-K or a low-K dielectric or no dielectric and represented as 170 in FIG. 11. If the second high-K dielectric is deposited, then low-K dielectric will cover this high-K dielectric; otherwise, no dielectric will be deposited, depending on the implementation and represented as 205 in FIG. 11.

Experimental demonstration of low turn on voltage and high breakdown Schottky barrier diode (SBD) with high-K dielectric is now described.

Figure 12:
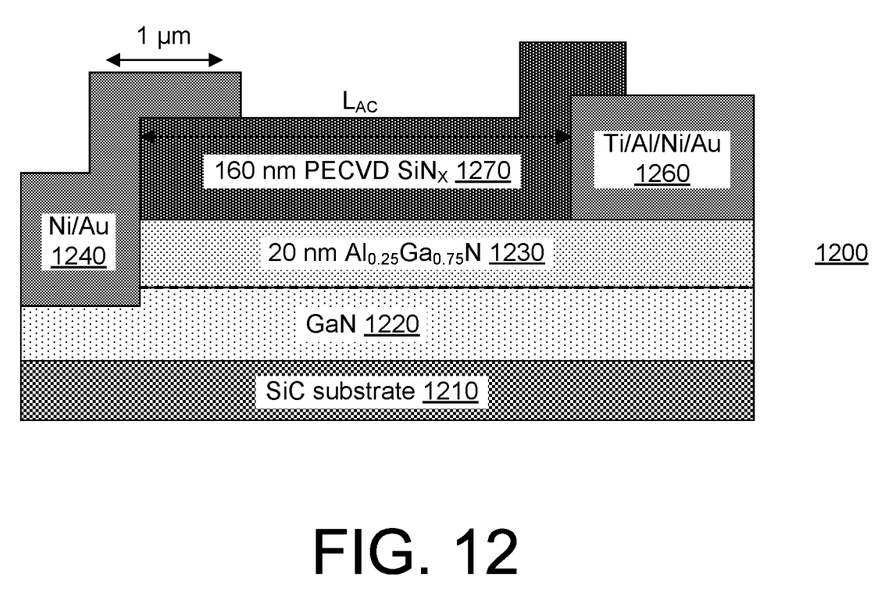
FIG. 12 is a schematic of control $SiN_x$ AlGaN/GaN Schottky barrier diode (SBD)
Figure 13:
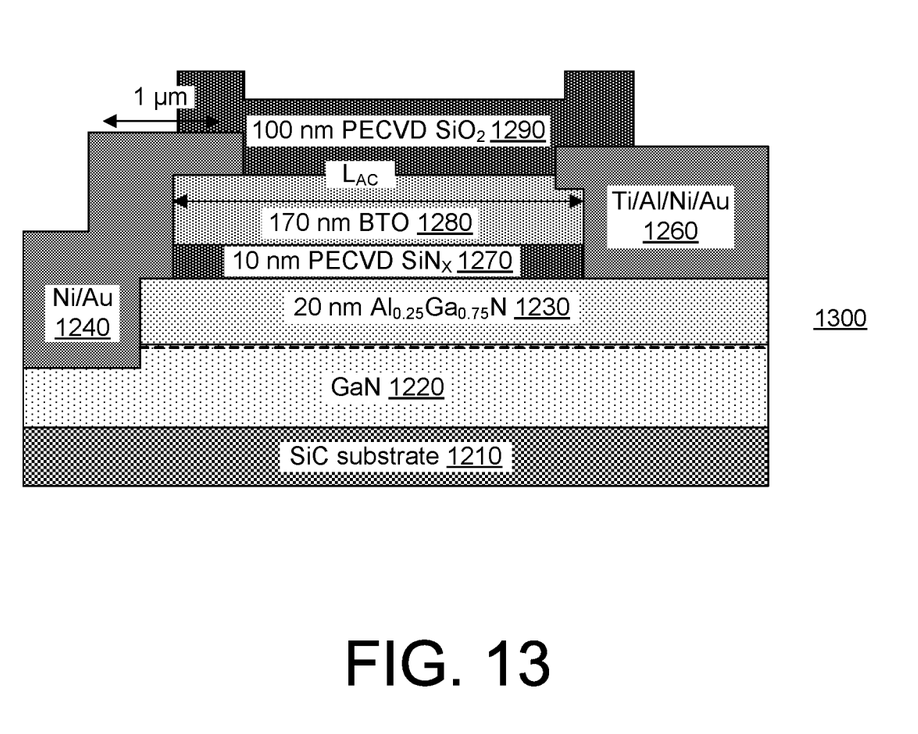
FIG. 13 is a schematic of BTO/$SiN_x$ AlGaN/GaN SBD.

FIG. 12 is a schematic of control $SiN_x$ AlGaN/GaN SBD 1200 (referred to herein as low-K SBD). FIG. 13 is a schematic of BTO/$SiN_x$ AlGaN/GaN SBD 1300 (referred to herein as high-K SBD). Two samples comprising 20 nm $Al_{0.25}Ga_{0.75}N$/GaN 1230 grown on SiC substrate 1210 with GaN channel layer 1220 by MOCVD.

Processing of a circular structure for both high and low permittivity devices (shown in FIGS. 13 and 12, respectively) started with ICP/RIE mesa isolation.

For the high-K SBD of FIG. 13, 10 nm $SiN_x$ was deposited by PECVD as a dielectric barrier layer 1270, followed by 170 nm $BaTiO_3$ (BTO) layer 1280 (a high-K dielectric) deposition using RF sputtering at 670° C. Then some of the BTO 1280 and $SiN_x$ 1270 were removed from both anode region (comprising 1240) and the cathode region (comprising 1260).

Cathode (Ti/Al/Ni/Au [20/120/30/50 nm]) metal 1260 was deposited using e-beam evaporation on both samples 1200 and 1300.

Then 160 nm $SiN_x$ 1270 as low-K dielectric was deposited by PECVD on low-K SBD (FIG. 12) and subsequently removed from the anode region.

Anode (Ni/Au [30/150 nm]) metal 1240 was deposited on both samples 1200 and 1300 using e-beam evaporation after etching of 25 nm of the AlGaN/GaN layer 1230. Finally, 100 nm of $SiO_2$ 1290 was deposited by PECVD on the high-K SBD (FIG. 13).

The various layers, components, thicknesses, materials, and placements of the layers described herein are intended to be representative of implementations and are not intended to be limiting. The example materials and thicknesses described with respect to FIGS. 12 and 13

The dielectric constant of the deposited high-K $BaTiO_3$ films was estimated to be ~175 from the accumulation region of the capacitance-voltage curve. Hall measurements show that the sheet carrier concentration, mobility, and sheet resistance are $8.5 \times 10^{12}$ $cm^{-2}$, 1810 $cm^2/V \cdot s$, and 402Ω/□ for low-K SBD and $7.3 \times 10^{12}$ $cm^{-2}$, 1780 $cm^2/V \cdot s$, and 482Ω/□ for high-K SBD. Experimental characteristics of devices with anode to cathode distance ($L_{AC}$) of 4, 5, and 6 µm were compared for low-K and high-K SBDs (FIGS. 12 and 13).

Figure 14:
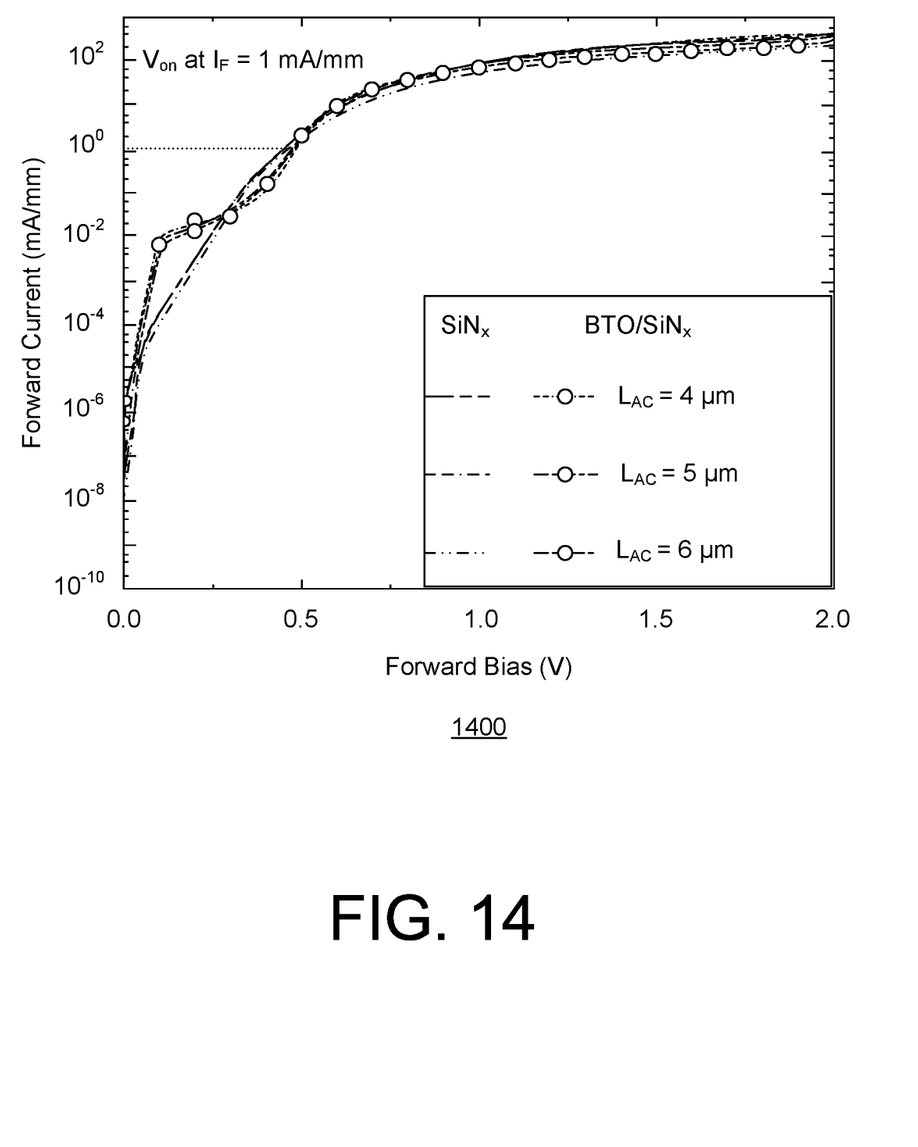
FIGS. 14 and 15 show forward two terminal I-V characteristics of $SiN_x$ and BTO/$SiN_x$ SBDs showing forward current in log scale and linear scale, respectively.
Figure 15:
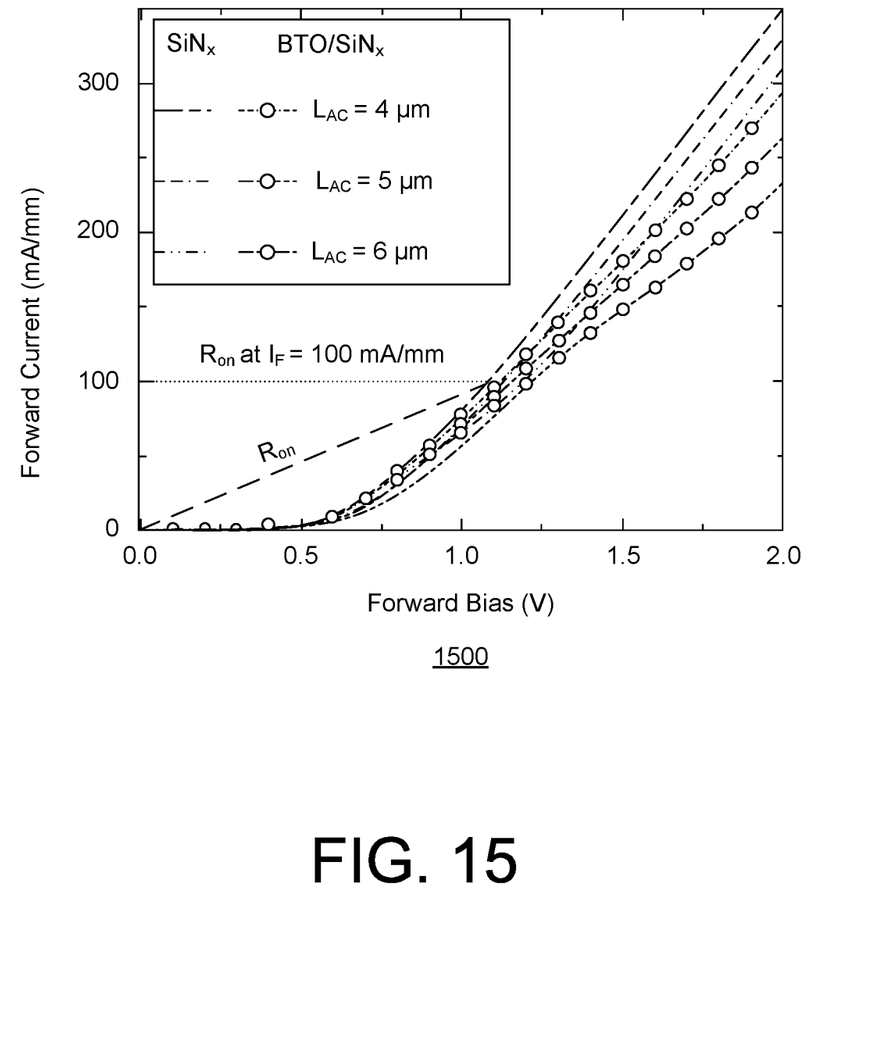
Figure 16:
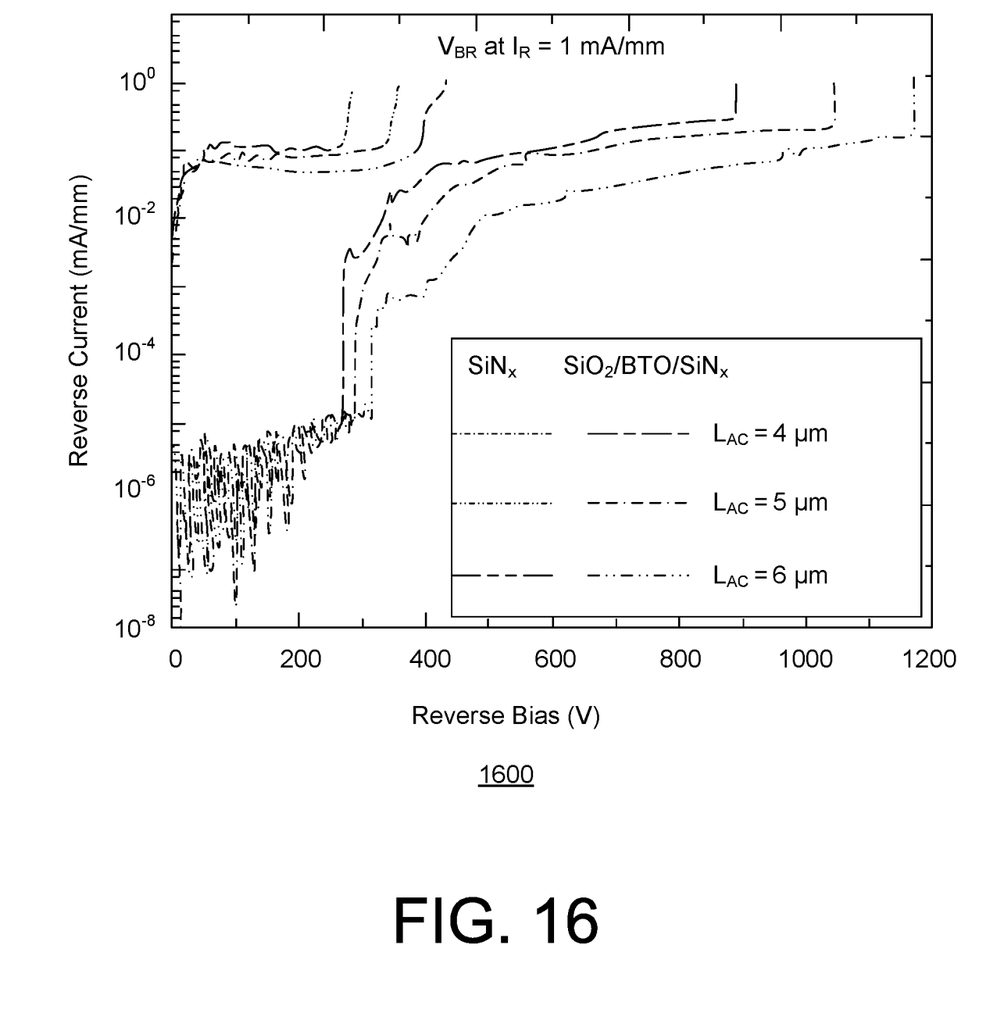
FIG. 16 shows two terminal reverse breakdown characteristics of both $SiN_x$ and BTO/$SiN_x$ SBD.
Figure 17:
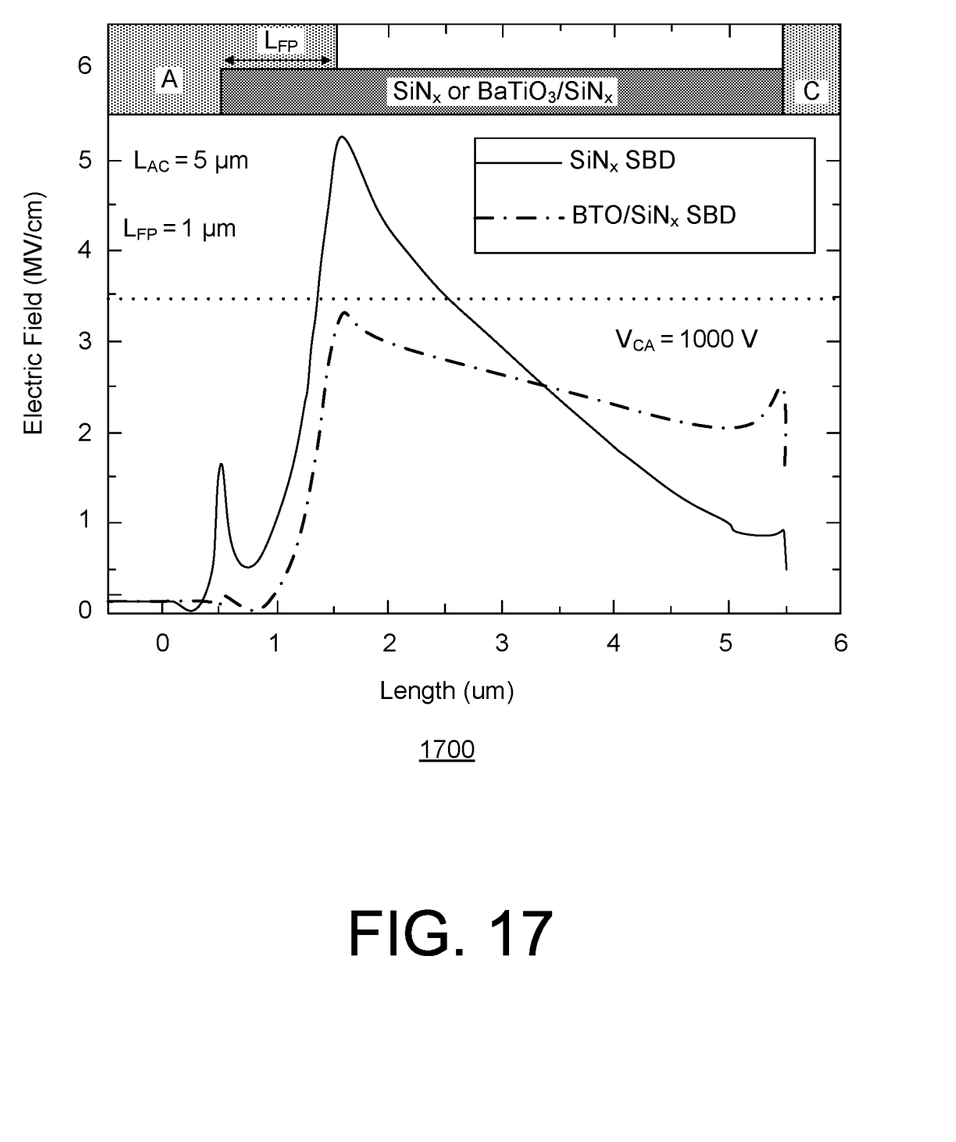
FIG. 17 shows electric field profile in channel of $SiN_x$ and BTO/$SiN_x$ SBDs simulated at reverse bias of 1000 V.
Figure 18:
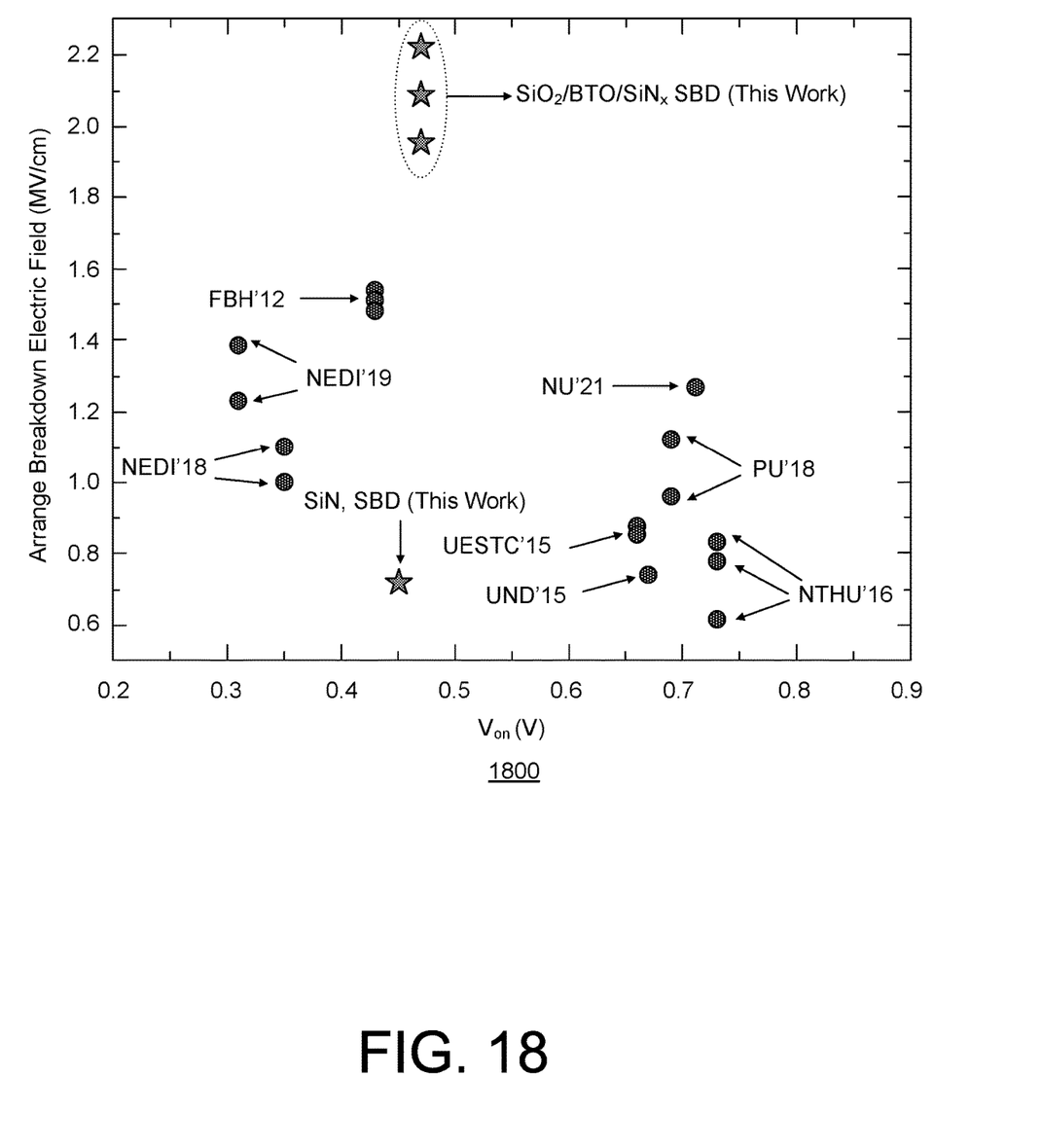
FIG. 18 shows average breakdown electric field vs. turn on voltage of both AlGaN/GaN SBDs compared with reported state of the art AlGaN/GaN SBDs.
Figure 19:
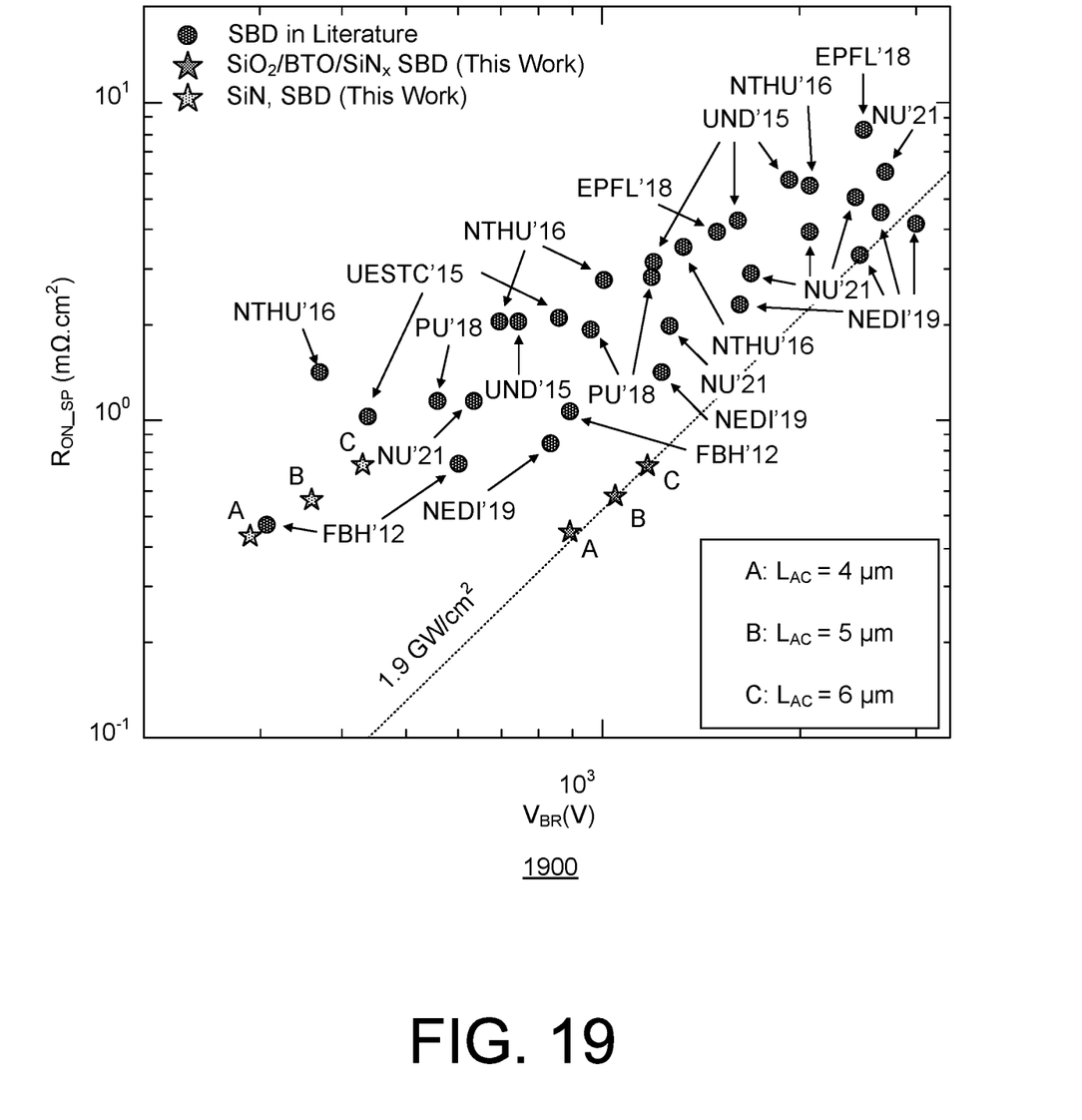
FIG. 19 shows power figure of merit (FOM) for both AlGaN/GaN SBDs compared with reported state of the art AlGaN/GaN SBD.

FIGS. 14 and 15 show forward two terminal I-V characteristics of low-K and high-K SBDs showing forward current in log scale and linear scale, respectively. FIG. 16 shows two terminal reverse breakdown characteristics of both low-K and high-K SBD. FIG. 17 shows electric field profile in channel of low-K and high-K SBDs simulated at reverse bias of 1000 V. FIG. 18 shows average breakdown electric field vs. turn on voltage of both low-K and high-K SBDs compared with reported state of the art AlGaN/GaN SBDs. FIG. 19 shows power figure of merit (FOM) for both low-K and high-K SBDs compared with reported state of the art AlGaN/GaN SBD.

Experimental forward characteristics shows turn on voltage (Von) of 0.45 V and 0.47 V for low-K and high-K SBDs, respectively (FIG. 14). To include the diode turn on voltage, the total resistance (rather than differential resistance) of both sets of diodes was measured at 100 mA/mm of forward current (FIG. 15). Calculated specific on-resistance of $L_{AC}$ of 4/5/6 µm devices was measured to be 0.43/0.56/0.71 mΩ·cm² for low-K SBDs and 0.44/0.57/0.72 mΩ·cm² for and high-K SBDs.

Reverse characteristics were measured to estimate the breakdown voltage ($V_{BR}$) using a criterion of 1 mA/mm (FIG. 16). The breakdown voltage was estimated to be 290 V (4 µm), 360 V (5 µm), and 430 V (6 µm) for low-K SBDs, corresponding to average electric fields of 0.71~0.73 MV/cm. The breakdown voltage was measured to be 889 V (4 µm), 1045 V (5 µm), and 1170 V (6 µm) for high-K SBDs, corresponding to average electric fields of 2.22~1.95 MV/cm. This 3.0~2.7 times increment of breakdown voltage in high-K SBDs is due to the reduction in leakage current and peak electric fields due to the dielectric superjunction effect of the high-K dielectric (FIG. 17).

The average electric field of all the devices for the high-K SBDs represents the highest breakdown field reported to date for lateral GaN SBDs for such low turn on voltage (0.47 V) (FIG. 18). To benchmark these results, the total on-resistance was compared with other reported lateral Schottky barrier diodes for GaN (FIG. 19). The reported result is among the best to date and shows that field management enabled by high permittivity dielectrics can provide significant improvement in the performance of lateral high voltage III-nitride devices.

Previous reports have proposed Schottky barrier diodes (T. Zhang, et. al. IEEE-EDL, vol. 40(10), p. 1583 (2019)) only where a low-permittivity dielectric was inserted between an anode and a cathode. However, these structures do not provide the advantages of using a high permittivity material which can create uniform electric field and reduce the field at the anode. Furthermore, high permittivity dielectrics have been proposed for three terminal transistors as in H. Hanawa, et al. IEEE-TED, vol. 61(3), p. 769 (2014). However, they do not teach the use of high permittivity dielectrics for a 2-terminal Schottky barrier with low turn-on voltage.

In an implementation, a lateral Schottky diode comprises: an anode; a cathode; and a high-K dielectric with dielectric constant greater than 25 disposed between the anode and the cathode.

Implementations may include some or all of the following features. The high-K dielectric is disposed in such way that a metal-semiconductor junction determines a low turn-on voltage and a metal/dielectric/semiconductor junction determines a high breakdown voltage. The diode further comprises a cathode region comprising the cathode, and an anode region comprising the anode. The anode region comprises at least one of an anode contact region or an anode field plate region. The cathode comprises an ohmic metal connected to a conducting channel, and further comprising at least one high-K dielectric and at least one low-K dielectric adjacent the cathode. The cathode region comprises a cathode contact and a high-K dielectric with a gap between the cathode contact and the high-K dielectric, wherein the gap is filled by one of a another high-K dielectric, a low-K dielectric, or remains empty. When the gap is filled by the another high-K dielectric, then one of a low-K dielectric or no dielectric is disposed on the another high-K dielectric. The cathode region comprises a cathode contact and a high-K dielectric, wherein a low-K dielectric is disposed on the high-K dielectric. The cathode region comprises a cathode contact with a metal extension field plate disposed toward the anode region, wherein the field plate is disposed on the high-K dielectric and is covered by one of another high-K dielectric, a low-K dielectric, or no dielectric. When the high-K dielectric is covered by the another high-K dielectric, then a low-K dielectric is disposed on the another high-K dielectric. The anode region comprises an anode contact and an anode field plate with adjacent high-K dielectric.

Implementations may include some or all of the following features. The anode comprises only Schottky metal or both Schottky metal and ohmic metal deposited after full or partial etching of a barrier layer. The anode comprises Schottky metal connected to a carrier channel from a side. The anode comprises Schottky metal and ohmic metal, wherein the ohmic metal is connected to a carrier channel, and the Schottky metal is unconnected to the carrier channel.

Implementations may include some or all of the following features. The diode further comprises an anode node field plate that comprises a metal extension and is connected to the anode, and is covered by at least one high-K dielectric and at least one low-K dielectric. The diode further comprises an anode node field plate that is disposed on a barrier layer and covered by another high-K dielectric, wherein a low-K dielectric is disposed on the another high-K dielectric. The diode further comprises an anode node field plate disposed on the high-K dielectric, and is covered by one of another high-K dielectric, a low-K dielectric, or no dielectric. When the high-K dielectric is covered by the another high-K dielectric, then a low-K dielectric is disposed on the another high-K dielectric. The diode further comprises an anode node field plate disposed on the high-K dielectric, and is covered by one of another high-K dielectric, a low-K dielectric, or no dielectric, wherein part of the high-K dielectric is deposited adjacent the anode in a partially etched barrier layer. The diode further comprises an anode node field plate wherein part of the field plate is disposed on the high-K dielectric and another part of the field plate is disposed on a barrier layer, and is covered by one of another high-K dielectric, a low-K dielectric, or no dielectric, and wherein when the high-K dielectric is covered by the another high-K dielectric, then a low-K dielectric is disposed on the another high-K dielectric.

As used herein, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A lateral Schottky diode comprising:
    an anode;
    a cathode; and
    a first high-K dielectric with dielectric constant greater than 25 disposed between the anode and the cathode, wherein the anode comprises an anode region and the cathode comprises a cathode region, and wherein the cathode region comprises a cathode contact and a second high-K dielectric with a gap between the cathode contact and the second high-K dielectric, wherein the gap is filled by one of a another high-K dielectric, or a low-K dielectric.

2. The diode of claim 1, wherein the first high-K dielectric is disposed in such way that a metal-semiconductor junction determines a low turn-on voltage and a metal/dielectric/semiconductor junction determines a high breakdown voltage.

3. The diode of claim 1, wherein the anode region comprises at least one of an anode contact region or an anode field plate region.

4. The diode of claim 1, wherein the cathode region comprises an ohmic metal connected to a conducting channel, and further comprising at least one high-K dielectric and at least one low-K dielectric adjacent to the cathode.

5. The diode of claim 1, wherein when the gap is filled by the another high-K dielectric, then a low-K dielectric.

6. The diode of claim 1, wherein the cathode region comprises a cathode contact and a high-K dielectric, wherein a low-K dielectric is disposed on the high-K dielectric.

7. The diode of claim 1, wherein the cathode region comprises a cathode contact with a metal extension field plate disposed toward the anode region, wherein the metal extension field plate is disposed on the first high-K dielectric and is covered by one of another high-K dielectric, or a low-K dielectric.

8. The diode of claim 7, wherein when the first high-K dielectric is covered by the another high-K dielectric, then a low-K dielectric is disposed on the another high-K dielectric.

9. The diode of claim 1, wherein the anode region comprises an anode contact and an anode field plate with an adjacent high-K dielectric.

10. The diode of claim 1, wherein the anode comprises only Schottky metal or both Schottky metal and ohmic metal deposited after full or partial etching of a barrier layer.

11. The diode of claim 1, wherein the anode comprises Schottky metal connected to a carrier channel from a side.

12. The diode of claim 1, wherein the anode comprises Schottky metal and ohmic metal, wherein the ohmic metal is connected to a carrier channel, and the Schottky metal is unconnected to the carrier channel.

13. The diode of claim 1, further comprising an anode node field plate that comprises a metal extension and is connected to the anode, and is covered by at least one high-K dielectric and at least one low-K dielectric.

14. The diode of claim 1, further comprising an anode node field plate that is disposed on a barrier layer and covered by another high-K dielectric, wherein a low-K dielectric is disposed on the another high-K dielectric.

15. The diode of claim 1, further comprising an anode node field plate disposed on the high-K dielectric, and is covered by one of another high-K dielectric, a low-K dielectric, or no dielectric.

16. The diode of claim 15, wherein when the high-K dielectric is covered by the another high-K dielectric, then a low-K dielectric is disposed on the another high-K dielectric.

17. The diode of claim 1, further comprising an anode node field plate disposed on the high-K dielectric, and is covered by one of another high-K dielectric, a low-K dielectric, or no dielectric, wherein part of the high-K dielectric is deposited adjacent the anode in a partially etched barrier layer.

18. The diode of claim 1, further comprising an anode node field plate wherein part of the anode field plate is disposed on the high-K dielectric and another part of the anode field plate is disposed on a barrier layer, and is covered by one of another high-K dielectric, a low-K dielectric, or no dielectric, and wherein when the high-K dielectric is covered by the another high-K dielectric, then a low-K dielectric is disposed on the another high-K dielectric.

* * * * *